United States Patent [19]

Buff

[11] 4,341,962

[45] Jul. 27, 1982

[54] ELECTRONIC GAIN CONTROL DEVICE

[75] Inventor: Paul C. Buff, Nashville, Tenn.

[73] Assignee: Valley People, Inc., Nashville, Tenn.

[21] Appl. No.: 156,059

[22] Filed: Jun. 3, 1980

[51] Int. Cl.³ .......................... G06G 7/12; G06G 7/24
[52] U.S. Cl. .................................. 307/492; 307/493; 328/145
[58] Field of Search ............... 307/492, 493; 328/144, 328/145

[56] References Cited

U.S. PATENT DOCUMENTS

| | | | |
|---|---|---|---|
| 3,532,868 | 10/1970 | Embley | 328/145 |
| 3,681,618 | 8/1972 | Blackmer | 307/492 |
| 3,714,462 | 1/1973 | Blackmer | 307/492 |
| 4,109,165 | 8/1978 | Katakura et al. | 307/492 |
| 4,225,794 | 9/1980 | Buff | 307/493 |
| 4,234,804 | 11/1980 | Bergstrom | 307/493 |

Primary Examiner—Stanley D. Miller, Jr.
Assistant Examiner—B. P. Davis
Attorney, Agent, or Firm—Harrington A. Lackey

[57] ABSTRACT

An electronic gain control device including a first bipolar circuit having log transfer functional elements, preferably in the form of a pair of parallel first transistors of different polarities, and a second bipolar circuit including antilog transfer function elements, preferably a pair of second transistors connected in parallel and of opposite polarity. A gain control signal is summed with the log output signal of the first bipolar circuit to produce a second output signal antilogarithmically related to the first output signal and the gain control signal.

The log and antilog transfer functional elements receive a bias signal of sufficient magnitude relative to the input signal that the entire circuit is in continuous electrical conduction in order to operate in a class A domain.

Preferably a diode, such as a diode connected transistor, is connected in series with each emitter lead in each of the transistors incorporated in the first bipolar and second bipolar circuits to provide class A operation with a minimum of distortion and noise.

24 Claims, 4 Drawing Figures

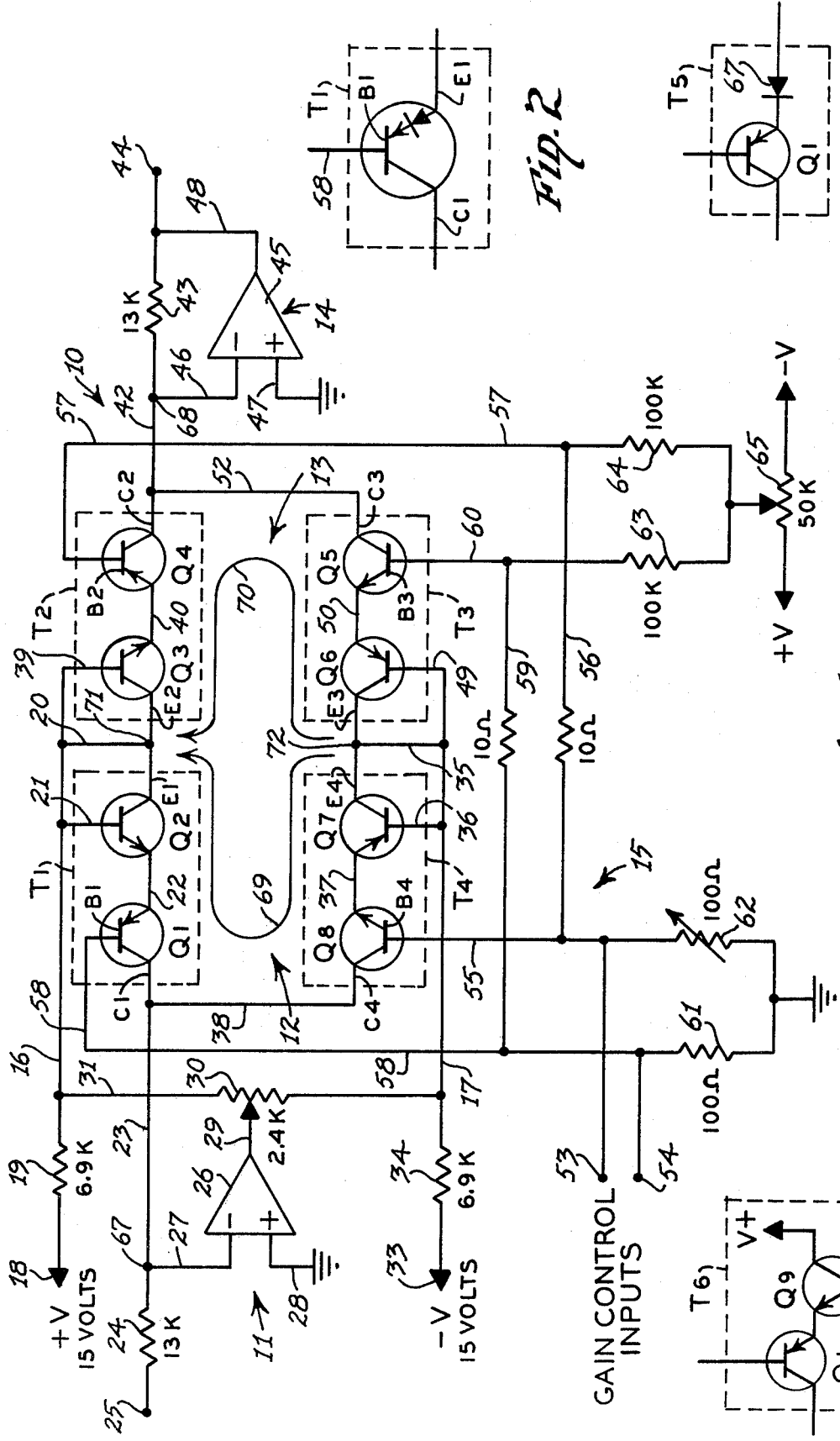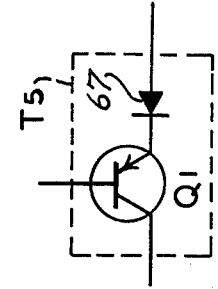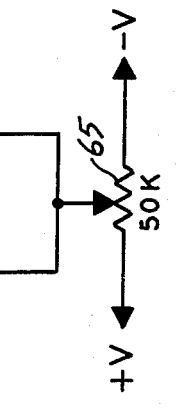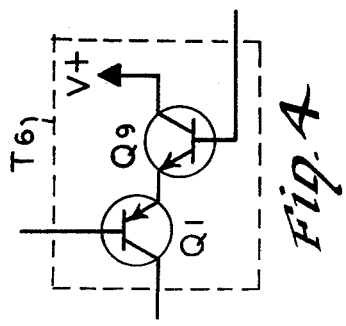

ELECTRONIC GAIN CONTROL DEVICE

BACKGROUND OF THE INVENTION

This invention relates to a device for the electronic control of gain or attenuation of an electronic signal. Such devices are commonly known as voltage controlled amplifiers (VCA), electronic gain controls (EGC), or electronic multipliers.

The function of such a device is to provide a signal input to which a signal current or voltage is applied, a control input to which a control voltage or current is supplied, and a signal current or voltage output. In operation, the magnitude of the signal output is governed by the magnitude of the input signal together with the magnitude and polarity of the control signal.

Such devices find application in audio automation systems, audio signal processing devices such as limiters, compressors and expanders, as well as in a wide variety of industrial systems wherein the gain or loss of one signal requires control by another signal.

It is common that electronic multipliers function on a "linear multiplication basis," wherein a given percentage of change in control signal will result in an equal percentage of change in the signal gain, thus allowing direct mathematic calculations. However, in many applications such as audio work, it is desirable to employ a logarithmic relationship between the control and signal inputs. In such a relationship, a given increment of control change will cause a given percentage of signal gain change. For instance, such a scaling might be employed so that a one-volt change in control voltage causes a 20 decibel (100%) change in signal gain or loss. It is also common, in such logarithmically responding devices, to provide for a nominal signal gain of unity, with zero control voltage or current applied, and to provide signal amplification for one polarity of control while providing signal attenuation for the opposite polarity of applied control voltage or current.

Particularly for applications in the control of professional audio signal, the performance of EGC devices is governed by very stringent requirements, in terms of noise levels, distortion production, gain control range, gain control linearity and rejection of control signals at the signal output.

Many designs have been advanced for the purposes outlined here, ranging from photocell and FET transistor control, digital methods, and methods involving use of the inherent logarithmic multiplication capabilities of the bipolar transistor junctions. The latter methods have generally proven most satisfactory and are in the widest use.

The properties of the bipolar transistor are known and well documented as well as being very predictable. Of particular concern to the art of electronic multiplication and gain control, is the relationship between the voltage of the base/emitter junction versus the collector current. This relationship follows an exacting log law, wherein at room temperture, a 60 milivolt change in base/emitter voltage will result in, or be caused by, a 20 dB, or one decade, change in collector current. This result is thermally modified at the rate of $+0.3\%$/degree C., and such thermal scaling is entirely predictable. Transistors suitable for these uses are typified as exhibiting base/emitter voltages in the order of 600 millivolts, at room temperture, with collector currents in the order of 1 milliampere.

In addition to the aforementioned scale factor of 60 mv/decade $+0.3\%$/degree C., there is a second thermally sensitive base/emitter voltage term known as "bulk offset voltage," which varies at the rate of about 2.2 millivolts per degree C. While the 60 mv/decade scale factor term is precise and constant between transistors of one manufactured type, the bulk offset term is subject to variations from unit to unit. As an example, given a number of transistors from a manufactured batch, the measured base/emitter voltages may vary over perhaps a 30 millivolt range. It is not a difficult process to "match" transistors into pairs or quads, which all exhibit base/emitter voltages within less than one millivolt of one another. When two or more units are so matched, they are capable of excellent log/antilog tracking, and form the basis for multiplier circuits using this art.

One inherent problem exists, however, in that the bipolar transistor is capable of passing current only in one direction (unipolar flow), while many signals to be processed are of a bipolar nature, or require current flow in two directions or polarities. Thus, some method must be devised to allow the processing of a bipolar signal in an inherently unipolar medium. This may be done by biasing the signal so as to limit its domain to one polarity domain as in the U.S. Embley U.S. Pat. No. 3,532,868, or by directing each half or polarity of the input signal to one of a pair of transistor paths, as in the Blackmer U.S. Pat. No. 3,714,462, or the Buff U.S. Pat. No. 4,225,794, issued Sept. 30, 1980.

Still another problem encountered, when very low distortion performance is required, is the presence of a pure resistance, resulting from the base/emitter physical connection, which appears to be in series with the generated log/antilog function of the transistor element. This resistance, at the higher operating currents, causes a deviation from a true log/antilog transfer function which, if not compensated for, leads to signal waveform distortion.

The Blackmer U.S. Pat. No. 3,714,462 teaches a configuration wherein a pair of transistors of opposite polarity are connected in feedback configuration around an operational amplifier to form a split-path, bipolar, log-function generator. Means for summing a control voltage are provided so that the sum of the log of the input signal and the control signal is presented to a split-path antilog function generator consisting of a pair of transistors of opposite polarity feeding a current to a voltage-converting operational amplifier stage. A slight bias is applied to the logging transistors so that, as the input signal crosses zero volts, both logging transistors are in slight conduction. This bias eliminates the "dead zone" which might result as the input signal crosses the domain of one transistor to the domain of the other.

The Blackmer circuit provides the desired logarithmic relationship between control voltage and signal gain/loss, and exhibits unity signal gain at zero control volts. The circuit is capable of either gain or loss, depending on the polarity of the applied control voltage.

Since, in the Blackmer circuit, the quiescent bias current is much smaller than the typical signal current, the circuit is classified as Class AB. This structure has the advantage of producing low quiescent noise levels due to the low current, under no signal conditions. However, as signals are introduced, the noise level dramatically increases in proporation to the magnitude of the applied signal. This phenomenon is known as "modulation noise," and can be objectionable to professional users. A Class A structure, wherein the bias current is greater than the signal level, would effectively eliminate modulation noise, but would result in a generally higher overall noise level than the Class AB approach. The Embley U.S. Pat. No. 3,532,868 shows a Class A circuit.

A further problem associated with both the Blackmer and Embley circuits is the resistive component of the transistor base/emitter junction. As described earlier, this component leads to the production of an objectionable amount of signal distortion. Particularly in the Blackmer circuit, the distortion production is an odd-order harmonic due to the balanced nature of the circuit. It is generally accepted in audio work that odd-order harmonic distortion is perceived as being more objectionable than even-order harmonic distortion. In both the Blackmer and Embley circuits, a substantial amount of intermodulation distortion is produced by the non-linearities.

A further problem with the Blackmer circuit is the fact that one polarity of the signal waveform is processed by NPN transistors, while the other polarity is processed by PNP transistors. The two types of transistors, being of different manufacturing processes, necessarily have subtle differences in scale factor, temperature coefficients and related parameters. Consequently, more distortions are introduced due to unequal processing of the two waveform halves. Additionally, certain amounts of "crossover distortion" are introduced in the Blackmer circuit as the signal passes in conduction from one transistor to the other at, or near, zero crossings.

Still another problem with the Blackmer circuit stems again from the Class AB structure. Since each half of the signal waveform is processed in separate transistors, unequal heating of the log/antilog transistors can cause the amplitude of one signal half to vary with respect to the other half. This situation leads to the production of thermally induced, even-order distortion. Although Blackmer specifies the use of a "common heat sink," the extreme nature of the inherent thermal sensitivities involved do not allow for a substantial control of thermally induced distortion, even with a common heat sink, in a Class AB design. This sort of problem is inherently non-existent in a Class A design such as the Embley circuit, since both waveform halves of the A.C. signal are processed by the same transistor elements.

SUMMARY OF THE INVENTION

The object of the present invention is to produce an electronic gain control device (EGC) which offers a very wide and linear control range encompassing both gain and attenuation, very low noise levels, minimal modulation noise, extremely low distortion levels which are independent of thermal conditions, low control feed-through to the signal output, and a logarithmic relationship of control voltage or current to signal voltage or current gain, with the device exhibiting unity gain at a zero control voltage.

In attempting to configure such a device, it was felt that a Class A biasing arrangement was necessary in order to achieve very low distortion. However, Class A operation is normally accompanied by an intolerable quiescent noise level. The bulk of the noise generation in a logarithmic amplifier is due to the amplification by the logging transistor of the noise voltage and current which appears at the base of the transistor. The noise voltage may be minimized by choosing large geometry transistors and operating at relatively high current levels. The effects of the transistor noise current may be minimized by the employment of low circuit impedances at the base and emitter terminals. In spite of these fundamental methods of noise reduction, a further decrease is needed to fit the requirements outlined above.

In this invention, the transconductance, or amplification factor, of the transistors themselves is reduced by placing degenerating diodes in the emitter leads of the actual logging transistors and in the antilogging transistors. This expedient effects a 6 dB reduction in transconductance, resulting in a lowering of the noise level produced by each connected pair of transistors relative to the noise level of a single transistor. Accordingly, the noise levels are reduced to a level allowing successful Class A operation. Such a connection also causes each pair of transistors to act as a single transistor having a doubled scale factor of 120 millivolts of base/emitter voltage per decade of collector current.

In configuring a biasing arrangement, it was kept in mind that any arrangement which allows the device to exhibit large gains (on the order of 40 dB to 60 dB) would necessitate that the bias current itself not be subjected to the high amplification to which the signal currents would be subjected. For example, if a fixed bias of 1 milliampere were passed through the logging transistors and the EGC were directed to have 60 dB of gain, a circuit which allowed the bias current to be subjected to this gain would result in a bias current of 1 ampere through the antilog transistors. Under such conditions, it would be impossible to achieve reasonable noise levels, distortion levels or control signal rejection due to the excessive currents involved. In a circuit, such as that of the subject invention, it is easily seen that as the gain of the device is increased, the input signal handling capabilities are reduced as the combination of a large input signal and a high circuit gain would simply overload the output stages. It is known in the electronics industry that high gain amplifiers have small input signal capabilities, and vice versa.

Thus, instead of applying a fixed bias to the logging transistors, the invention employs a biasing network which takes a fixed amount of total bias current and divides it proportionately between the logging transistors and the anti-logging transistors, as required by the directed gain of the EGC. At unity gain, this bias current is evenly split between the logging transistors and the antilogging transistors, since at unity gain both the input signal current and output signal current are identical and have identical bias requirements. As attenuation is directed by the control circuit, more of the total bias current shifts to the logging transistors and less to the antilogging transistors. As gain is directed, more of the total bias current shifts to the antilogging transistors and less to the logging transistors. In this manner, the total bias current remains constant, rather than being amplified or attenuated by the control circuit. The action of the bias circuit is to adjust the ratio of bias currents in the log and the antilog stages to exactly the same proportions as the signal currents are divided between these stages, while maintaining a constant total bias current. For example, under high gain conditions, a small input signal is amplified into a large output signal. Accordingly, a small input bias and a large output bias are present.

BRIEF DESCRIPTION OF THE DRAWINGS

FIG. 1 is a schematic circuit diagram of the electronic gain control device made in accordance with this invention;

FIG. 2 is an enlarged schematic circuit diagram of the electronic equivalent of the effective transistor disclosed in FIG. 1;

FIG. 3 is a schematic electronic circuit diagram of a modified form of effective transistor; and FIG. 4 is a enlarged schematic electronic circuit diagram of a second modified effective transistor.

DESCRIPTION OF THE PREFERRED EMBODIMENTS

Referring now to the drawings in more detail, FIG. 1 discloses an electronic gain control device 10 made in accordance with this invention.

Essentially, the electronic gain control device 10 includes a signal input stage 11, a first bipolar logging circuit 12, a second bipolar anti-logging circuit 13, an output signal stage 14, gain control circuitry 15, a positive bias circuit 16, and a negative bias circuit 17.

The first bipolar circuit 12 includes two pair of transistors Q1-Q2 and Q8-Q7 connecting in parallel, but with the transistors Q1-Q2 and Q8-Q7 in each pair being connected in series. The PNP transistor Q1 is of opposite polarity to the NPN transistor Q2, while the NPN transistor Q8 is of opposite polarity to the PNP transistor Q7.

The positive bias circuit 16 which includes a supply terminal 18 connected to a source of positive voltage, such as +15 volts indicated in FIG. 1, and a resistor 19, is connected through lead 20 to the collector E1 of the transistor Q2, and through lead 21 to the base of the same transistor Q2. The emitters of the two transistors Q1 and Q2 are coupled by lead 22.

The collector C1 of the transistor Q1 is connected to the signal input lead 23, including resistor 24 and terminating in signal input terminal 25.

The signal input stage 11 includes an input operational amplifier 26 having its negative input connected through lead 27 to the input lead 23 through junction 67, and its positive input lead 28 connected to ground. The output lead 29 of the operational amplifier 26 is variably connected to a potentiometer 30 in bridge line 31 connecting the positive bias circuit 16 and the negative bias circuit 17.

The negative bias circuit 17 receives its source of negative bias voltage, such as −15 volts, through it negative input terminal 33 and resistor 34. The negative bias circuit 17 is connected through lead 35 to the collector E4 of the transistor Q7, and through the lead 36 to the base of the same transistor Q7. The emitters of the two transistors Q7 and Q8 are coupled by the lead 37. The collector C4 of the transistor Q8 is connected through lead 38 to the signal input line 23, thus completing the parallel connections of the two pairs of transistors Q1-Q2 and Q8-Q7.

The second bipolar circuit 13 also includes two pairs of transistors Q4-Q3 and Q5-Q6 connected and arranged in a manner complementary to the transistors Q1-Q2 and Q8-Q7 in the first bipolar circuit 12. The same positive bias input lead 20 connecting the collector E1 of the transistor Q2, also is connected to the collector E2 of the transistor Q3 in the second bipolar circuit 13. Moreover, the positive bias line 16 is also connected to the base of the transistor Q3 through the lead 39. The emitters of the two transistors Q3 and Q4 are connected by the common lead 40, and the collector lead C2 of the transistor Q4 is connected to the output signal line 42, which includes in series the resistor 43 and the output signal terminal 44 in the output stage 14. The output stage 14 also includes an output operational amplifier 45 whose negative input terminal is connected through lead 46 to the output signal line 42 through junction 68, and whose positive input is connected through lead 47 to ground. The output of the operational amplifier 45 is connected through output lead 48 to the output signal line 42 on the opposite side of the resistor 43 from junction 68.

The same negative bias lead 35 connected to the collector lead E4 of the transistor Q7 is also connected to the collector lead E3 of the transistor Q6. The negative bias line 17 is also connected to the base of the transistor Q6 through the lead 49. The emitters of the pair of transistors Q5 and Q6 are coupled through lead 50, while the collector C3 of the transistor Q5 is connected through lead 52 to the output signal line 42.

The gain control circuitry 15 includes a pair of gain control input terminals 53 and 54. Gain control terminal 53 is connected to base lead 55 connected to the base B4 of transistor Q8 in the first bipolar circuit 12, and also through resistive lead 56 to the base lead 57 connected to the base B2 of the transistor Q4 in the second bipolar circuit 13.

Gain control terminal 54 is connected directly to the base lead 58, connected to the base B1 of the transistor Q1 in the first bipolar circuit 12, and also through resistive line 59 to base lead 60 connected to the base B3 of the transistor Q5 in the second bipolar circuit 13.

The gain control terminals 54 and 53 are also connected to ground through the respective resistor 61 and potentiometer 62. The base leads 57 and 60 are also connected to a bias voltage source through resistors 63 and 64 and potentiometer 65.

It will be noted that each of the four pair of transistors Q1-Q2, Q3-Q4, Q5-Q6, and Q7-Q8, includes one PNP transistor and one NPN transistor, so that the transistors in each pair are of opposite polarity.

Moreover, each of the transistors Q2, Q3, Q6, and Q7 are electrically connected as diodes in series with the corresponding emitter leads 22, 40, 50 and 37, so that each pair of transistors Q1-Q2, Q3-Q4, Q6-Q5 and Q7-Q8 functions as effective transistors T1, T2, T3 and T4, respectively, as illustrated by the rectangular phantom lines of FIG. 1. An alternate illustration of the effective transistor T1 is shown in FIG. 2.

Furthermore, in each of the respective effective transistors T1-T4, the effective emitters, bases and collectors have been illustrated by the letters E1, B1, C1; E2, B2, C2; E3, B3, C3; E4, B4, and C4.

FIGS. 3 and 4 illustrate modified forms of effective transistors, each of which could be substituted for any-one of the effective transistors T1-T4.

In FIG. 3, the diode 67 has been substituted for a diode-connected transistor, such as Q2.

In FIG. 4, a second transistor Q9 has been substituted for a diode-connected transistor, such as the transistor Q2. However, the collector of the transistor Q9 is not connected to the bias voltage line 16, but to separate voltage source V+.

While in the preferred embodiment of the invention each effective transistor is composed of a first transistor, such as Q1, having in its emitter lead a second transistor, such as Q2, which is connected as a diode and which is of the opposite polarity to the first transistor, derivation of the circuit wherein the second transistor is connected as a transistor, such as Q9 in FIG. 4, or wherein the second transistor is replaced by an actual diode, such as 67 in FIG. 3, do not deviate from the scope of the invention and are contemplated by the invention. The operation of the device 10 is as follows:

Beginning at terminal 18 (a source of +15 volts), and excluding the effect of potentiometer 30 and operational amplifier virtual ground points 67 and 68, a current path exists through resistor 19, line 16, lead 20, where the current is then split through transistor paths 69 and 70, lead 35, line 17, and resistor 34 to terminal 33, which is a source of −15 volts. Current path 69 includes in series transistors Q2, Q1, lead 38 and transistors Q8 and Q7. Current path 70 includes in series transistors Q3, Q4, lead 52 and transistors Q5 and Q6. Since points 67 and 68 are held to a xero-volt potential by the transistor feedback circuits around amplifiers 26 and 45, and since each transistor drops about 0.6 volts (one diode drop), there exists at junction 71 a positive potential of about 1.2 volts, and at junction 72 a negative potential of about 1.2 volts.

In the invention all NPN transistors (Q2, 3, 5 & 8) are matched for base/emitter voltage, as are all PNP transistors (Q1, 4, 6, & 7).

At a control setting of unity gain, zero volts is applied to gain control input terminals 53 and 54, which results in zero-volt potential at the bases B1, B2, B3 and B4, assuming potentiometer 65 balanced at mid-position.

As was stated earlier, each transistor Q1, 4, 5, & 8, together with its associated diode-connected companion transistor Q2, 3, 6 & 7 may be considered as a single transistor T1–T4, having a double scale-factor of 120 mv/decade.

The bases B1 and B2 of the effective transistors T1 and T2 are both at zero volts, while their common emitter junction 71 is at a common potential of about +1.2 volts. Since the transistors T1 and T2 are matched, and are presented with equal base/emitter voltages, their collector currents are also equal. The same analysis is also applied to effective transistors T3 and T4. Therefore, at the unity gain setting (zero control volts) the bias current is evenly divided between paths 69 and 70. The value of each resistor 19 and 34 is adjusted to provide the desired level of bias through paths 69 and 70, as well as through potentiometer 30. For the values shown in FIG. 1, a total of 2 ma current is provided. 1 ma flows through potentiometer 30, while the remaining 1 ma is divided equally between paths 69 and 70 at unity gain, with each path receiving 0.5 ma.

None of the bias current flows into either virtual ground point 67 or 68, since the same amount of current flows through resistors 19 and 34. It might be thought that an imbalance in either the power supply voltage or in the values of resistors 19 and 34 would cause part of the bias current to flow into virtual grounds 67 and 68. The circuit is self-correcting in this respect, since any bias current which flows into the inverting input of amplifier 36 is amplified by the open loop gain of the amplifier 26, thereby producing a correction voltage at its output 29. This correction voltage tends to balance the bias currents in such a manner as to prevent any appreciable current from flowing into the inverting input of amplifier 45 where it would produce an undesirable output offset voltage at output terminal 44.

In the above description of the bias networks, it was assumed that the control terminals 53 and 54 had zero volts applied, thus directing unity signal gain. When a gain other than unity is directed, the bias current is divided unequally. If, for example, a voltage of +120 mv is applied to input terminal 54, while terminal 53 is left at zero volts, a forward gain of 20 decibels is directed. If we now look at the relationship of the pair of effective transistors T1 and T2, B2 has a base voltage of zero volts (as applied from terminal 53 through resistive line 56), while B1 has a base voltage of 120 mv, as supplied from terminal 54 through lead 58. Since effective transistors T1 and T2 have a common emitter potential at junction 71, but have a difference in base voltage of 120 mv, their base/emitter voltages differ by 120 mv, with T2 having a higher base/emitter voltage than T1. Since the effective transistors exhibit a scale factor which prescribes a decade of difference in collector current for a 120 mv difference in base/emitter voltage, 10 times as much bias current is directed through T2 than T1. Using the same analysis, it can be seen that the base/emitter voltage of T3 is 120 mv greater than that of T4, thereby causing 10 times as much bias current to flow through T3 as T4. Thus, the bias current directed through path 70 is 10 times greater than that directed through path 69. Since a total of 1 ma is available for passage through both paths, 0.909 ma flows through path 70 while 0.0909 ma flows through path 69.

The mechanics are such that the application of positive control voltages to terminal 53 will cause gain at the rate of 1 decade/120 mv, while the application of negative voltages to terminal 54 will produce attenuation at the same rate. For terminal 53 the situation is reversed, in that positive voltages cause attenuation, while negative voltages produce gain, all at the 120 mv/decade rate. A further study of the control inputs shows that it is in fact the voltage differential between the two terminals 53 and 54, which causes EGC gain or loss. Therefore, if the same voltage is applied to both terminals 53 and 54, the effects will cancel, leaving the device at unity gain, as if both terminals were grounded to zero volts. This arrangement increases the flexibility of the control circuit for many applications requiring differential voltage control.

The above discussion of the physics of the bias mechanism also applies to the signal itself.

Input signal voltages are applied to terminal 25 and converted to currents flowing through resistor 24 and virtual ground point 67. In accordance with accepted operational amplifier theory, these input currents do not flow in and out of the operational amplifier input 27, but rather must flow in and out of the operational amplifier output 29 through the feedback path. This feedback path consists of, beginning at output 29, current flow through potentiometer 30 to bias lines 16 and 17, then through effective transistors T1 and T4 and leads 23 and 38 to junction 67, and then through resistor 24 to the input terminal 25.

At zero input current, as stated earlier, a bias current is flowing through path 69 and the current flow through T1 is the same as through T4. As a signal current is applied, and depending upon the polarity of said signal current, the output at 29 swings either positive or negative, thus adding or subtracting from the bias current flow through T1, and having the opposite effect on the bias current flowing through T4. The action of the feedback mechanism assures that for any given input signal current, an equal amount of feedback current must flow. This equality can only be achieved through an imbalance in the respective currents through T1 and T4, equal to the amount of input signal current flow. As an example, assume the EGC were directed to have unity gain, and were biased in accordance with values indicated in FIG. 1, and thus had a quiescent bias current of 0.5 ma through each of the four effective transistors T1, T2, T4, and T3, under no signal conditions. If now a +2.6 volt signal were applied to input terminal 25, a current flow of 0.2 ma would be caused to flow through resistor 24. This current flow would tend to cause output signal in lead 29 to swing in a negative direction, thereby adding to the bias current flowing through T4, and reducing the bias current flow through T1. The severity of this alteration of currents would be of such magnitude as to cause a 0.2 ma difference in the currents through T1 and T4. The resulting currents would be 0.6 ma through T4 and 0.4 ma through T1. The 0.2 ma difference flows through line 38 and through resistor 24 to input terminal 25, thus satisfying the demand of the input voltage.

At the output section 14 under unity gain instruction, (zero volts at control inputs 53 and 54), the base/emitter voltages of T1 and T2 remain identical, thus forcing T2 to conduct an equal amount of current as does T1, that current being 0.4 ma in this example. It is also seen that T4 and T3 have identical base/emitter voltages, and so must have identical collector currents, which are 0.6 ma in this example. Accordingly, an imbalance of 0.2 ma now exists between the currents of T2 and T3. This current imbalance has no place to go but through resistor 43. Since point 68 is held at virtual ground, or zero-volt potential, and a voltage drop of 2.6 volts must exist across resistor 43 in order to allow the flow of 0.2 ma of current, output operational amplifier 45 must undergo a +2.6 volt swing at its output 44 in order to satisfy the demand and create equilibrium. Thus, as input signal of 2.6 volts positive results in an output voltage of 2.6 volts positive, as was instructed by the control terminals (unity gain instruction).

Had the input voltage been negative, rather than positive, the results would have been complementary, with effective transistors T1 and T2 undergoing higher than quiescent currents, while T4 and T3 would undergo lower than quiescent currents. As long as the input signal current is less than double the input bias current (path 69) neither effective input transistor will cease to conduct current, and Class A operation will result. On the other hand, should the input signal current exceed twice the input bias current, one effective input transistor will cease to conduct current (be cut off) while the other effective transistor increases in current conditions to whatever degree is demanded by the input signal current. Thus, the circuit ceases to act as a Class A circuit and begins to function as a Class AB circuit.

If voltage differences other than zero are applied to control inputs 53 and 54, the ratios of currents between T1 and T2, and between T4 and T3, will vary as a function of the applied control voltages in the same manner as did the ratios of the bias currents between these pairs of elements.

Reverting to a previous example, if a voltage of 120 mv were applied to terminal 54, while terminal 53 were left at zero-volt potential, a 20 dB gain instruction would result. Under this condition, the base/emitter voltage of T2 would be found to be 120 mv greater than that of T1, while the base/emitter voltage of T3 would be 120 mv greater than that of T4. Accordingly, the current through T2 would be 10 times that through T1, while the current through T3 would be 10 times that through T4. Thus, the difference in currents between T2 and T3 would be 10 times the difference between the currents through T1 and T4, the current through resistor 43 would be 10 times the current through resistor 24, and the output voltage would be 10 times the input voltage. Thus, the directed 20 dB gain has been accomplished. The effect of various control voltage combinations applied to the division of bias currents also applies to the division of signal currents. The gain control range is accurate and useable over a range of around 60 dB gain through 120 dB loss. Since in the normal operation of the device 10, none of the transistors cease to conduct some amount of current, no crossover, or "dead area," distortion results.

As for the distortion components caused by the resistive component of the log/antilog transistor elements, the balanced Class A configuration of the invention fully cancels the effects of this non-linearity. This can be exemplified by noting that as current is increasing in one of the effective log transistors T1 or T4 or antilog transistors T2 or T3, thus producing a "positive error," the current is decreasing in another of the effective log or antilog transistors T1–T4, thereby producing a complementary "negative error," which cancels the "positive" error. Since the transistors are well matched, the degree of cancellation of these error terms is very exacting and leads to nearly immeasurable distortion production.

In analysing the mechanism which leads to the cancellation of this error term, it is seen that complementary effects exist horizontally (between T1 and T2, and between T4 and T3), vertically (between T1 and T4, and between T2 and T3), and diagonally (beweeen T1 and T3, and between T2 and T4). In this respect, it should be carefully noted that in each of these cancellation quadrants (horizontal, vertical and diagonal), for each PNP transistor there is a PNP complementary counterpart, and for each NPN transistor there is an NPN complementary counterpart. Thus, in addition to achieving a complete cancellation of the error components caused by the resistive components of the log/antilog generators, there is also a complete cancellation of any inherent differences in the parameters of the NPN transistors versus the PNP transistors. Again, each effective transistor is composed of an NPN transistor and a PNP transistor, and has parameters identical to the other effective transistors.

The fully symmetrical form of balancing and cross-balancing, in addition to assuring very low distortion production, also results in a very high degree of cancellation of the control terminal voltages at the device output terminal 44.

A further cancellation scheme exists in the method by which the effective transistor bases are coupled. As can be seen from FIG. 1, a diagonal cross-coupling of the bases B1–B3 and B2–B4 exists through resistive lines 59 and 56, respectively. At the relatively high values of current flow within the transistors, inequalities in the transistor base currents can cause error voltages to be developed across even the low values of the base current return resistors 61 and 62. However, the bulk of any such generated error voltages are cross-coupled via lines 59 and 56 to a complementary effective transistor, thereby cancelling the effect of the error voltage described.

As for the remainder of the circuitry, even with close matching of the individual transistors, enough matching discrepancy exists to preclude rejection of the control voltage from the device output. Potentiometer 65 permits the injection of a small, adjustable offsetting voltage, which is fed through resistors 63 and 64 to produce a small change in the effective base/emitter voltage matching of effective transistors T2 and T3. Through this means, the circuit may be adjusted for complete rejection of the control voltage at the output.

Potentiometers 30 and 62 permit trimming the drive currents and base impedance ratios as a final means for adjusting the minutest variations in matching the transistors, as required for extremely low distortion production.

The circuit values, voltages, currents, and transistor polarities and orientations, are illustrative, and changes or reversals of polarities should not cause a deviation from the scope of the invention.

What is claimed is:

1. An electronic gain control device, comprising:
   (a) a first bipolar circuit having an input for receiving an input signal and an output, said first bipolar circuit comprising first elements for producing log transfer functions and adapted to produce a log signal all said output logarithmically related to said input signal,
   (b) means for summing a gain control signal with said log signal at said output,
   (c) a second bipolar circuit connected to the output of said first bipolar circuit and comprising second elements for producing anti-log transfer functions and adapted to produce an output signal anti-logarithmically related to the sum of said log signal and said gain control signal, and
   (d) bias means for applying a bias current of said first and second elements of such value that said elements are continuously in electrical conduction through both polarities of an AC input signal applied to said input, to cause said first and second bipolar circuits to operate in a class A domain.

2. The invention according to claim 1 in which said first bipolar circuit comprises an operational amplifier, said first elements comprising a pair of transistors of opposite polarities connected in feedback configuration with said operational amplifier, said bias means biasing said transistors so that current through one transistor increases while current through the other transistor decreases, and vice versa, as the polarity of said input signal alternates.

3. The invention according to claim 2 in which a diode is connected in series in the emitter lead of each transistor.

4. The invention according to claim 2 in which said pair of transistors are first and second transistors, a third transistor connected in series in the emitter lead of said first transistor, and a fourth transistor connected in the emitter lead of said second transistor.

5. The invention according to claim 4 in which each of said third and fourth transistors are connected as diodes in said respective emitter leads.

6. The invention according to claim 5 in which each of said third and fourth transistors are of opposite polarity from their corresponding first and second transistors.

7. The invention according to claim 1 in which said second elements comprise a pair of transistors of opposite polarity connected to said first bipolar circuit, for producing said output signal.

8. The invention according to claim 7 further comprising a diode connected in series with the emitter lead of each said transistor.

9. The invention according to claim 7 in which said pair of transistors comprises first and second transistors, a third transistor connected in series with the emitter lead of said first transistor, and a fourth transistor connected in series with the emitter lead of said second transistor.

10. The invention according to claim 9 in which each of said third and fourth transistors are connected as diodes in the corresponding emitter leads of said first and second transistors.

11. The invention according to claim 10 in which each of said third and fourth transistors are of opposite polarity from their corresponding first and second transistors.

12. The invention according to claim 1 in which said bias means applies a constant total bias current to said first and second elements regardless of the magnitude or polarity of said gain control signal.

13. The invention according to claim 12 in which said bias current is divided between said first and second bipolar circuits proportionately as a function of the magnitude and polarity of said gain control signal.

14. The invention according to claim 1 in which the signal current of said input signal is divided between said first and second bipolar circuits proportionately as a function of the magnitude and polarity of said gain control signal.

15. The invention according to claim 1 in which said first elements comprise a pair of first transistors and said second elements comprise a pair of second transistors, and control means for applying said gain control signal to the base of at least one of said transistors.

16. The invention according to claim 15 in which said control means applies said gain control signal to the bases of said first transistors.

17. The invention according to claim 15 in which said control means applies said gain control signal to the bases of said second transistors.

18. The invention according to claim 15 in which said control means applies said gain control signal to one of said first transistors and to one of said second transistors.

19. The invention according to claim 15 in which said control means applies said gain control signal to both said first transistors and both said second transistors.

20. The invention according to claim 1 comprising a plurality of gain control signal inputs and means for applying a different gain control voltage to each of said inputs.

21. The invention according to claim 20 in which said gain control signal comprises a voltage differential between voltages applies to at least two of said gain control signal inputs.

22. The invention according to claim 1 in which said first and second elements are matched in their parameters of base emitter voltage, scale factor and bulk resistance.

23. The invention according to claim 1 in which said elements which produce said log and antilog transfer functions are matched in their parameters of base emitter voltage, scale factor and bulk resistance.

24. The invention according to claim 1 further comprising adjustable means for minimizing error signals in said circuits.

* * * * *